United States Patent
Oomori et al.

(10) Patent No.: US 7,103,284 B2
(45) Date of Patent: Sep. 5, 2006

(54) LIGHT-EMITTING MODULE

(75) Inventors: Hirotaka Oomori, Yokohama (JP); Haruki Yoneda, Yokohama (JP); Shigeo Hayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 645 days.

(21) Appl. No.: 10/255,105

(22) Filed: Sep. 26, 2002

(65) Prior Publication Data
US 2003/0081289 A1 May 1, 2003

(30) Foreign Application Priority Data
Sep. 28, 2001 (JP) ............................. 2001-298785
Sep. 28, 2001 (JP) ............................. 2001-302495

(51) Int. Cl.
*H04B 10/04* (2006.01)
*H01S 3/042* (2006.01)

(52) U.S. Cl. .................... 398/182; 372/38.02; 372/33; 372/34; 372/35; 372/36

(58) Field of Classification Search ........ 398/182–188, 398/196; 372/38.02, 33–36
See application file for complete search history.

(56) References Cited

U.S. PATENT DOCUMENTS

| | | | | |
|---|---|---|---|---|
| 4,834,477 A | * | 5/1989 | Tomita et al. | 359/209 |
| 4,997,243 A | * | 3/1991 | Aiki et al. | 385/92 |
| 5,737,077 A | * | 4/1998 | Lee et al. | 356/317 |
| 5,926,303 A | * | 7/1999 | Giebel et al. | 398/117 |
| 6,061,158 A | * | 5/2000 | DeLong | 398/196 |
| 6,192,170 B1 | * | 2/2001 | Komatsu | 385/15 |
| 6,198,558 B1 | * | 3/2001 | Graves et al. | 398/135 |
| 6,282,352 B1 | * | 8/2001 | Kato et al. | 385/92 |
| 6,332,720 B1 | * | 12/2001 | Shimaoka et al. | 385/88 |
| 6,572,279 B1 | | 6/2003 | Takagi | 385/92 |
| 6,757,499 B1 | * | 6/2004 | Aoki | 398/182 |
| 6,823,145 B1 | * | 11/2004 | Shirai et al. | 398/182 |
| 2002/0018627 A1 | * | 2/2002 | Kato et al. | 385/93 |

* cited by examiner

Primary Examiner—Kenneth Vanderpuye
Assistant Examiner—Danny Wai Lun Leung
(74) Attorney, Agent, or Firm—McDermott Will & Emery LLP

(57) ABSTRACT

A light-emitting module according to the present invention contains a Peltier element driver, and a signal processor for controlling the Peltier element driver. The Peltier element driver is mounted on a first substrate, which directly attaches to the inner bottom surface of the housing, while the signal processor is mounted on the other substrate spaced to the first substrate. The first substrate and the other substrate are vertically integrated within the housing. This arrangement enables to encase the Peltier element driver and the signal processor in the housing with effective thermal dissipation.

18 Claims, 13 Drawing Sheets

LIGHT-EMITTING MODULE

BACKGROUND OF THE INVENTION

1. Field of the Invention

The present invention relates to a light-emitting module, especially, a module for a wavelength division multiplexing (WDM) system.

2. Related Prior Art

In the WDM communication system, the minimum wavelength interval between respective signal channel is set to be 0.8 nm or less, this means that the absolute accuracy of the wavelength is controlled within ±0.1 nm. To realize such absolute accuracy, temperatures of respective optical sources is controlled individually by a feedback loop. Namely, the temperature of the semiconductor laser of respective channel is monitored, is compared with a preset value, and adjusted by changing the current providing to the Peltier element because the wavelength of light emitted from the semiconductor laser depends on the temperature.

Conventional light-emitting module is shown in FIG. 18. The module comprises a semiconductor laser, a thermoelectric cooler such as a Peltier element, an optical fiber and a housing, the laser and the Peltier element encases therein. The laser is mounted on the Peltier element so as to control a temperature of the laser. The Peltier element is driven from the outside of the housing. To apply such conventional module to the WDM system, additional circuits must be provided for respective channel outside the module housing, thus results in a complicated and a large sized system.

To realize a compact sized module and a simple optical source system, it is necessary to encase the Peltier driver circuit in the housing. However, as shown in FIG. 18, the conventional housing has no rest room to put the circuit therein.

SUMMARY OF THE INVENTION

The object of the claimed invention is to provide a solution for above-mentioned subject. Namely, the module of the present invention encases the light-emitting device such as a laser diode, a Peltier element and a Peltier driver circuit therein. The Peltier driver circuit may be mounted on a first wiring substrate attached to the inner bottom surface of the housing. This arrangement enhances heat dissipation from the driver circuit to the outside of the housing through the bottom of the housing.

The claimed invention may include a signal processor for driving the Peltier driver circuit with responding the monitored signal from the light-receiving device, such as photo diode, and the temperature-sensing device, they are concurrently installed with the laser diode. The signal processor may be mounted on a second wiring substrate that is overhead of the first wiring substrate. A connector provided conductive lines therein couples both substrates with each other.

A conductive plate may be inserted between the first wiring substrate and the second wiring substrate. This plate plays a role of a shield, which electrically isolates the second wiring plate from the first wiring plate.

Further, the claimed invention may include a first sub-assembly at the side of the primary assembly composed by the laser diode, the photo diode, and the temperature-sensing device. The first wiring plate mounting the laser driver circuit thereon is contained in the first sub-assembly. The level of the first wiring plate may correspond with that of the primary assembly, thus the electrical connection between the laser diode and the laser driver circuit becomes easy. It further facilitates the electrical connection and enhances high frequency performance of the module to balance the level of the first wiring plate with the level of lead terminals protruded from the side of the housing.

The claimed invention may further include a second sub-assembly at the other side of the primary assembly. The second sub-assembly contains a second wiring plate on which an amplifier circuit is mounded for amplifying a monitored signal from the photo diode and the temperature-sensing device, and for transmitting the amplified signal to the signal processor on the second wiring substrate. The level of the second wiring plate may correspond with that of the primary assembly and that of lead terminals, thus facilitates the electrical connection between sub-assemblies.

Still further object of the present invention is to provide a multi-channel optical source, especially for the WDM system. The optical source contains a plurality of optical modules constructed in a way explained hereby, an inner bus connecting modules, an outer bus, and a slave controller. The slave controller is directed from a master controller placed out of the source through the outer bus, translates the direction, and sends the direction to respective modules through the inner bus. Two busses may have different protocol, such as the RS232-C standard for the outer bus and the $I^2C$ standard for the inner bus. The optical source thus constructed realizes a compact sized and a simple configuration because respective modules have the Peltier driver circuit and the signal processor therein.

DETAILED DESCRIPTION OF THE INVENTION

FIRST EMBODIMENT

Figure 1:
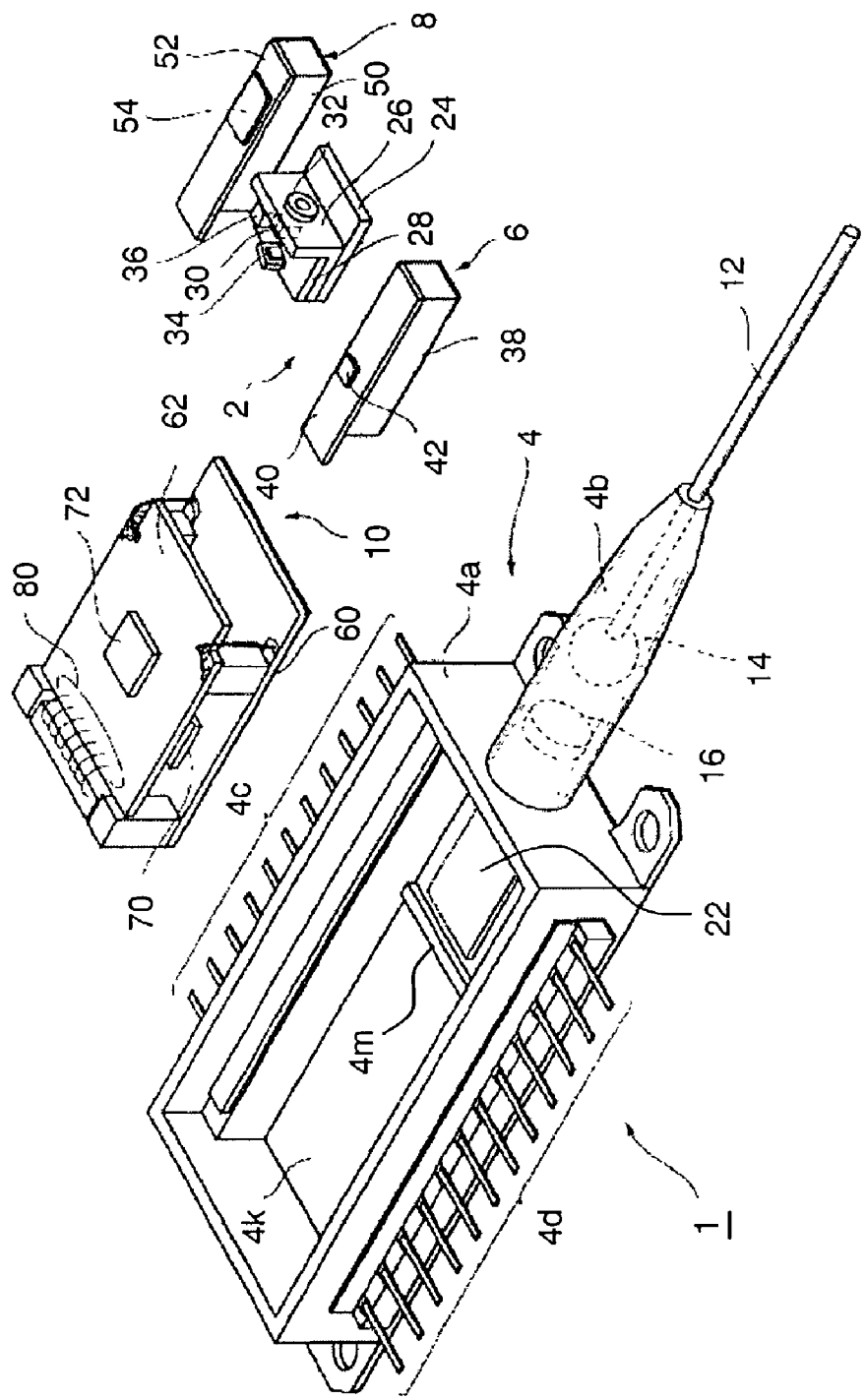
FIG. 1 is an exploded view showing the present light-emitting module.
Figure 2:
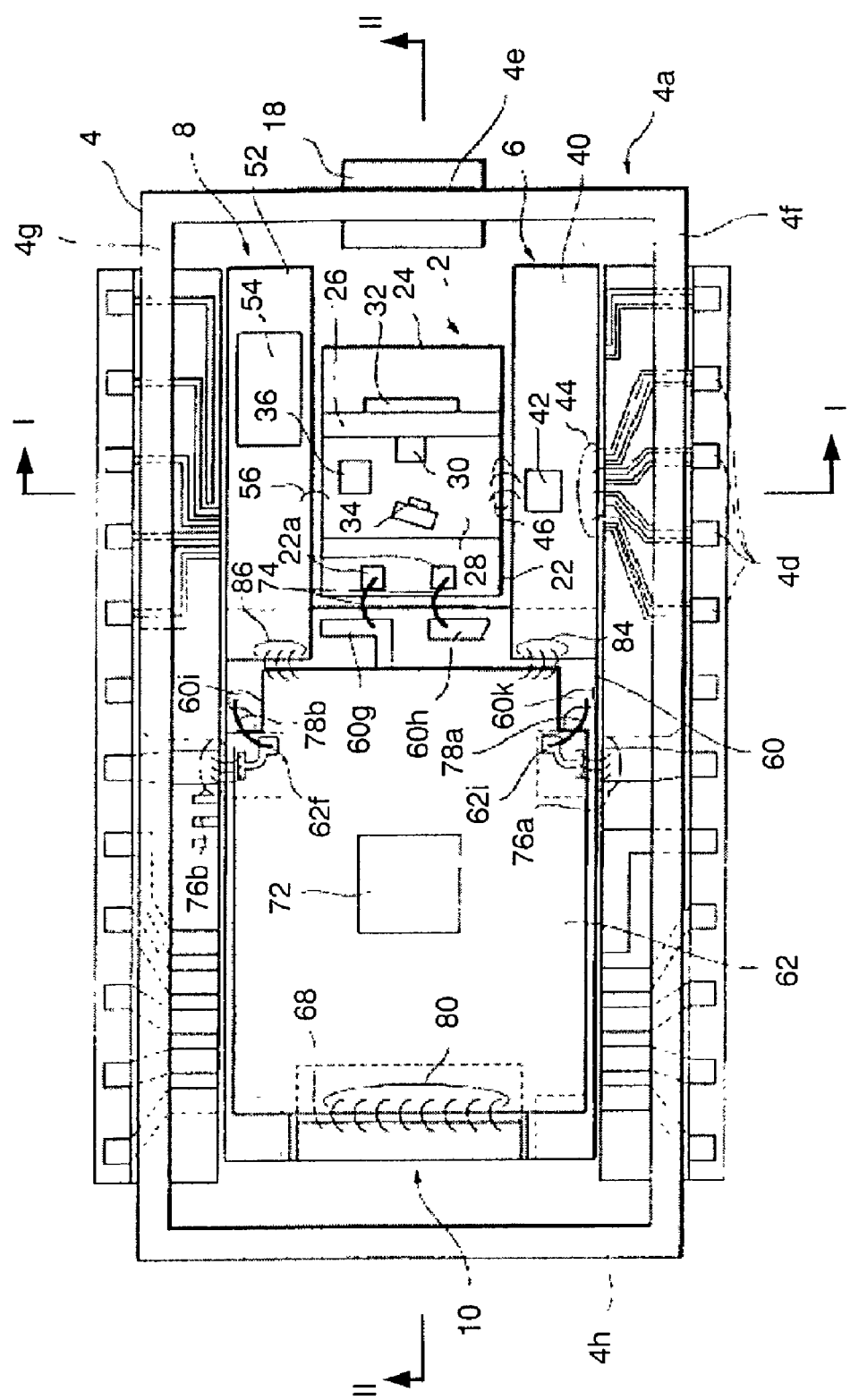
FIG. 2 is a plane view showing the arrangement of respective assemblies installed within the housing.

FIG. 1 is an exploded view showing a light-emitting module of the claimed invention and FIG. 2 is a plane view of the module. The module 1 comprises a primary assembly 2, a first sub-assembly 6, a second sub-assembly 8, a third sub-assembly 10 and housing 4. The housing 4 shapes a butterfly package and comprises a body 4a that encases all of sub-assemblies (2, 6, 8, and 10) therein, lead terminals (4c, 4d), and a cylinder 4b for securing an optical fiber 12. The cylinder 4b is formed in the front wall of the body 4a and supports the fiber 12 so as to couple the primary assembly 2 to the fiber. Lead terminals (4c, 4d) are arranged at respective sides of the body 4a and electrically connected to the first sub-assembly 6, the second sub-assembly 8, and the third sub-assembly 10. The cylinder 4b contains a lens 14 held by a lens holder that is not shown, and occasionally an isolator 16, a ferrule that protects the tip of the fiber 12, and a ferrule holder for holding the ferrule.

The primary assembly 2 comprises a Peltier element 24, a container 26 with an L-like shape on the Peltier element, and a chip carrier 28 on the container 26. The Peltier element 24 adjusts a temperature of a light-emitting device mounted thereon. A substrate 22 is placed on the bottom of the body 4a, a pair of wiring pattern 22a is provided on the top of the substrate 22, through which current for driving the Peltier element 24 is conveyed.

The semiconductor light-emitting device 30 such as a laser diode, a semiconductor light-receiving device 34 such as a photo diode, and a temperature-sensing device 36 such as a thermister are placed on the chip carrier 28. The one facet of the laser diode 30 is optically coupled to the fiber 12 through the lens 32, while the other facet of the laser diode is coupled to the photo diode 34. The thermister monitors the temperature of the laser diode 30.

The front wall of the body 4a provides an aperture 4e, through which light emitted from the laser 30 passes to the cylinder 4b. A hermetic glass so as to seal the body 4a covers the aperture 4e.

The first sub-assembly comprises an auxiliary member 38, a first wiring plate 40 on the auxiliary member 38, and a laser driver 42. Some electrical passive elements are also on the first wiring plate 38. The first sub-assembly locates between the primary assembly 2 and one side 4f of the housing. The laser driver 42 receives a signal from the lead terminal 4d through bonding wires 44 and sends a driving signal to the laser diode 30 through wires 46.

The second sub-assembly 8 comprises an auxiliary member 8, a second wiring plate 50 on the auxiliary member 8, and an electronic circuit 54 on the wiring plate 50. The second assembly 8 locates between the primary assembly 2 and another side 4g of the housing. This arrangement enables the photo diode 34 to be provided an electrical power from the wiring plate 52 and to send a monitored signal to the plate 52. Further, the temperature-sensing device 36 enables to provide a sensed signal to the substrate 52. Bonding wires 56 connect the chip carrier 28 in the primary assembly to the second wiring plate 52 in the second sub-assembly. This arrangement, coupled with the arrangement of the first sub-assembly, separates the high-speed signal and the monitored signal that is direct current type signal, thus enhances the stability of the operation.

Since the first wiring plate 40 in the first sub-assembly 6 extends from the auxiliary member 38 so as that the plate 40 faces to the third sub-assembly, it is easy bonding wires 84 connect the plate 40 to the another substrate 62 in the third sub-assembly 10. Similarly, the second wiring plate 52 in the second sub-assembly extends from the auxiliary member 50 so as to connect the plate 52 to another substrate 62 in the third sub-assembly by bonding wires 86.

Figure 3:
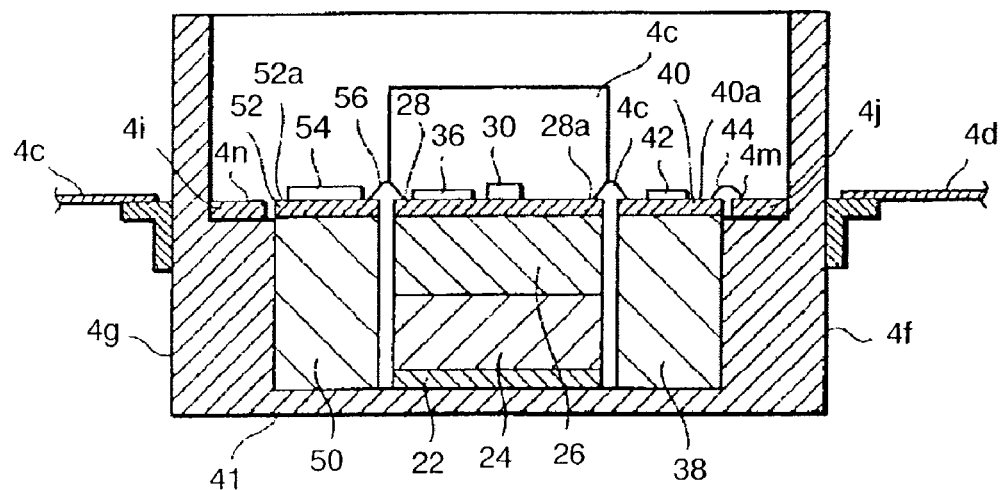
FIG. 3 is a cross sectional view along I—I in FIG. 2.

FIG. 3 is a cross sectional view along I—I in FIG. 2. The thickness of the auxiliary member 38 is adjusted so as that the level of the primary surface 40a of the first wiring plate 40 corresponds to that of a surface 4m of a housing portion 4j. Similarly in the primary assembly, the level of the primary surface 28a of the chip carrier 28 corresponds with that of the primary surface 40a in the first sub-assembly. Further in the second sub-assembly, the level of the primary surface 52a of the second wiring plate 52 corresponds with that of a surface 4n of a housing portion 4i. These arrangement enables to coincides the level of respective wiring plate within ±300 μm and enhances a high speed performance over 2.5 Gbit/sec.

Since the auxiliary member 38 contacts not only to the inner bottom surface of the housing 4 but also to the side wall, heat generated by the laser driver 42 can be conveyed to the outside of the housing through the side wall. In order to spread heat effectively, the auxiliary member 38 is made of metal such as CuW that shows greater thermal conductivity than Kovar or stainless steel.

Figure 4:
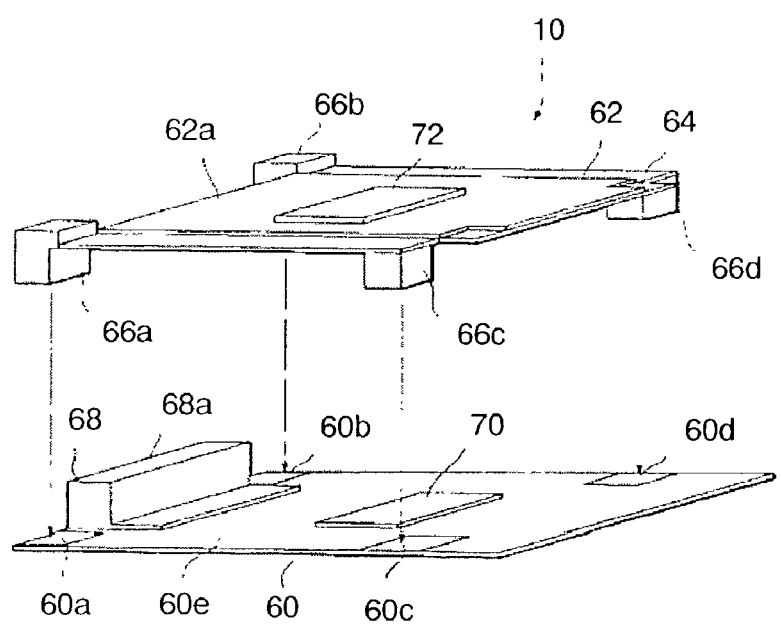
FIG. 4 shows a constructional view of the third assembly.

FIG. 4 shows the third sub-assembly, which comprises a first wiring substrate 60, a second wiring substrate 62, a conducting substrate 64, plural pillars (66a, 66b, 66c, 66d), a connector 60, a Peltier driver 70 and a signal processor 72. Pillars are made of metal blocks and are placed on respective conducting patterns (60a, 60b, 60c, 60d) on the first substrate 60, and support the second wiring substrate 62. In this arrangement, the conducting substrate is grounded through pillars, thus shields the second substrate 62 from the first substrate 60.

The connector is arranged on a conducting pattern 60e along an edge of the first substrate 60. The level of the upper surface 68e of the connector 68 coincides with that of the upper surface 62a of the second wiring substrate 62. This configuration enables wire bonding between the conducting pattern 62a on the second wiring substrate and the connector 68. The signal processor 72 is placed on the second substrate 62. The signal processor 72 generates a command signal for adjusting a temperature of the Peltier element 24 to the Peltier driver 70. Namely, the processor 72 receives a signal through the lead 4c, processes the signal and sends a command signal to the Peltier driver 70. The Peltier driver 70 receives this command and generates a corresponding current for adjusting the temperature of the cooler 24. Since the processor 72 does not drive the Peltier element, a power consumption of the signal processor 72 is quite smaller than that of the Peltier driver 70.

Figure 5A:
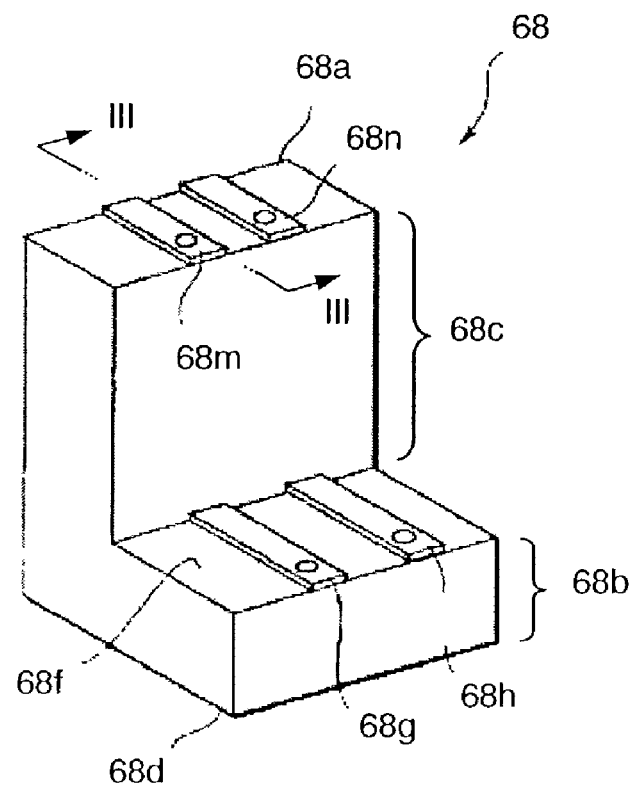
FIG. 5(a) is a view showing the connector for connecting the first wiring substrate and the second wiring substrate.
Figure 5B:
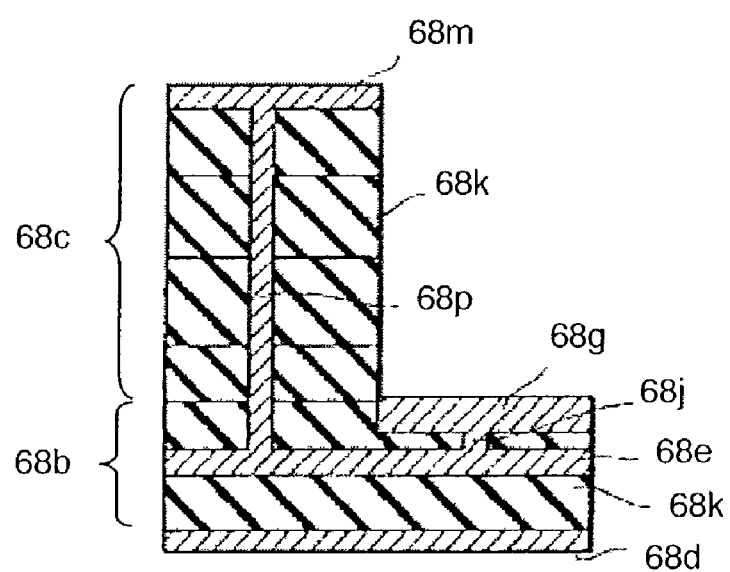
FIG. 5(b) is a cross sectional view of the connector.

FIG. 5(a) shows a perspective view of the connector 68, and FIG. 5(b) is a cross sectional view along III—III in FIG. 5(a). The connector 68 comprises a base portion 68b and a post portion 68c on the base portion 68b. The base portion 68b has a first surface 68f opposing to the bottom surface 68d and a bottom surface 68d attached to the conductive pattern on the first wiring substrate 60. On the surface 68f is a plurality of electrodes (68g, 68h). The base portion 68b has a buried layer 68e parallel to the bottom surface 68d. Conductive plugs connect electrodes (68g, 68h) on the surface 68f to the buried layer 68e. Insulator 68k such as ceramics separates these conductive layers. The post portion 68c has plurality of electrodes (68m, 68n) on the top surface 68a and a plug 68p for connecting the electrode 68m to the buried layer 68e. Another plug, not shown in FIG. 5(*b*) connects the electrode 68g to the another buried layer.

By the connector 68 thus constructed, the electrodes (68g, 68h) on the first surface 68f are electrically connected to corresponding electrodes (68m, 68n) on the second surface. Further, the electrodes (68g, 68h) are connected to the first wiring substrate 60 and the electrodes (68m, 68n) are connected to the second wiring substrate 62, thus the first substrate 60 electrically contacts to the second substrate 62.

Figure 6:
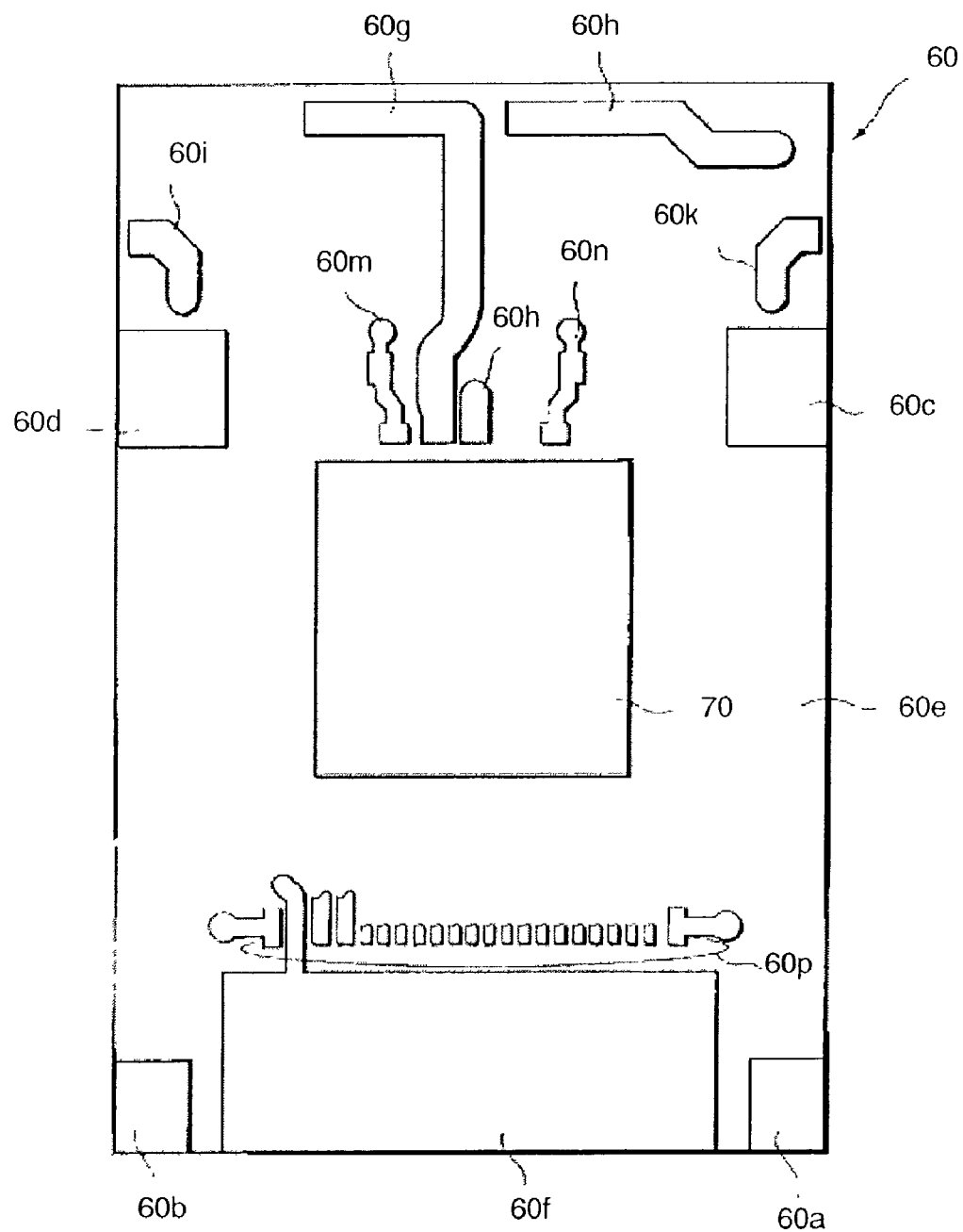
FIG. 6 shows a conductive pattern on the first wiring substrate.

FIG. 6 shows a typical conducting pattern on the first substrate 60. The substrate is made of multi-layered ceramics. The pattern 60f is formed along an edge opposing to a wall 4h of the housing 4. On the pattern 60f carries the connector 68. Opposite edge to the pattern 60f faces to the Peltier element 24. Between the edge and the Peltier driver 70 forms conducting patterns (60g, 60h) for conveying current to the Peltier element 24, the width of which are wider than other patterns (60i, 60k, 60m, 60n). Patterns (68i, 68k) are formed along respective edges opposing to walls (4f, 4g) of the housing 4 so as to bond wires, which are shown in FIG. 2 (78a, 78b), from the second wiring substrate 62. Further patterns 60p arranged so as to face to the pattern 60f are connected to electrodes (68g, 68h) on the first surface of the connector 68.

Figure 7:
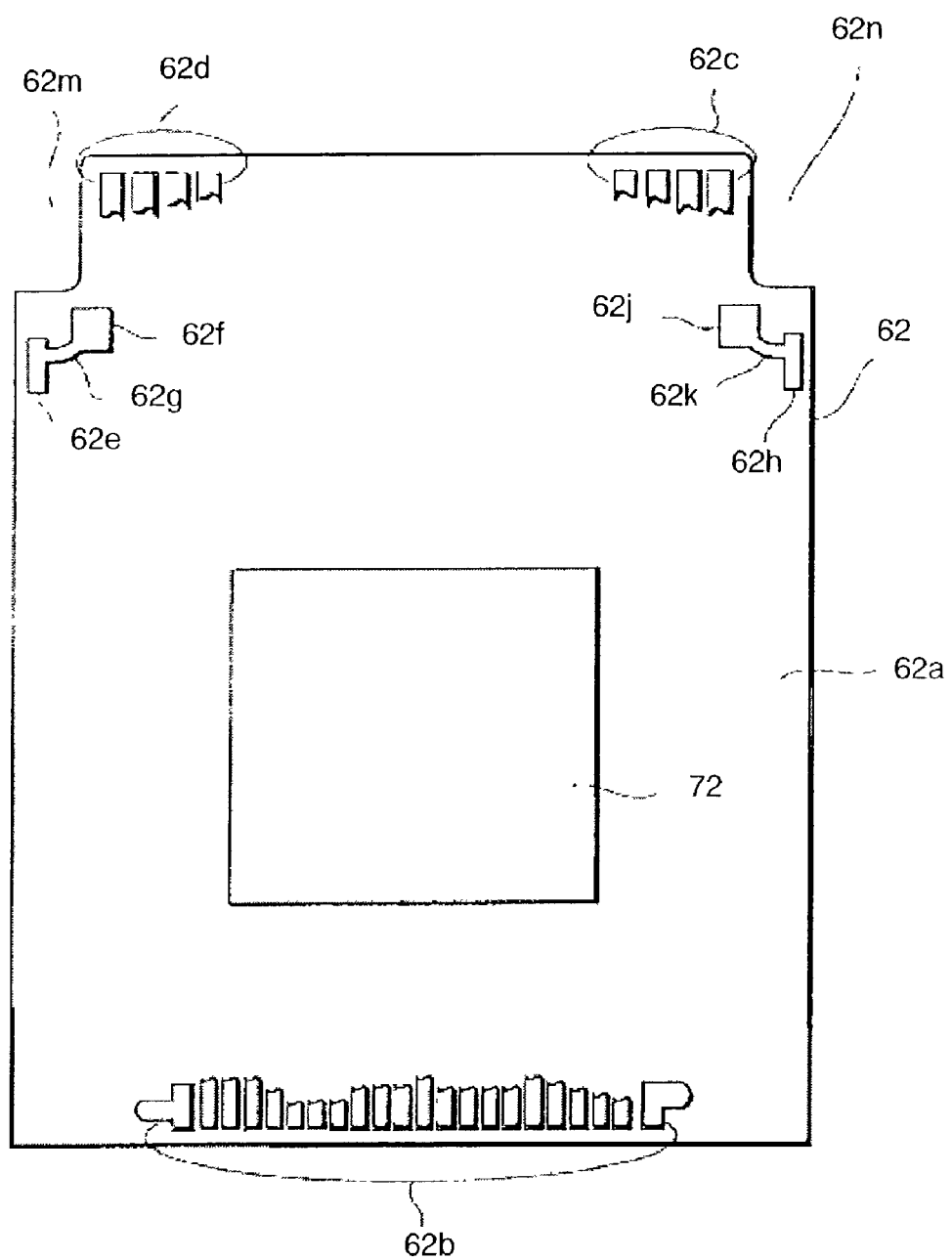
FIG. 7 shows a conductive pattern on the second wiring substrate.

FIG. 7 shows conducting patterns on the second wiring substrate 62, which is also made of multi-layered ceramics. Conducting patterns 62b are arranged along one edge opposing to the connector 68, they are connected to the electrodes (68m, 68n) on the second surface of the connector 68. Opposite edge to patterns 62b faces to the first wiring plate 40 of the first sub-assembly 6 and also to the wiring plate 52 of the second sub-assembly 8. Patterns 62c direct a signal to the laser driver 42, while patterns 62d receive a signal from the electronic circuit 54. Other conducting patterns (62e to 62g and 62h to 62k) convey current for the Peltier element 24. Patterns (62e, 62h) receives the current from corresponding terminals (4c, 4d) and patterns (62g, 62h) direct the current to the first wiring substrate 60 through bonding wires connected thereto (78a and 78b in FIG. 2). Bonding wires are guided from cutting portions (62m, 62n) of the second substrate 62.

Figure 8:
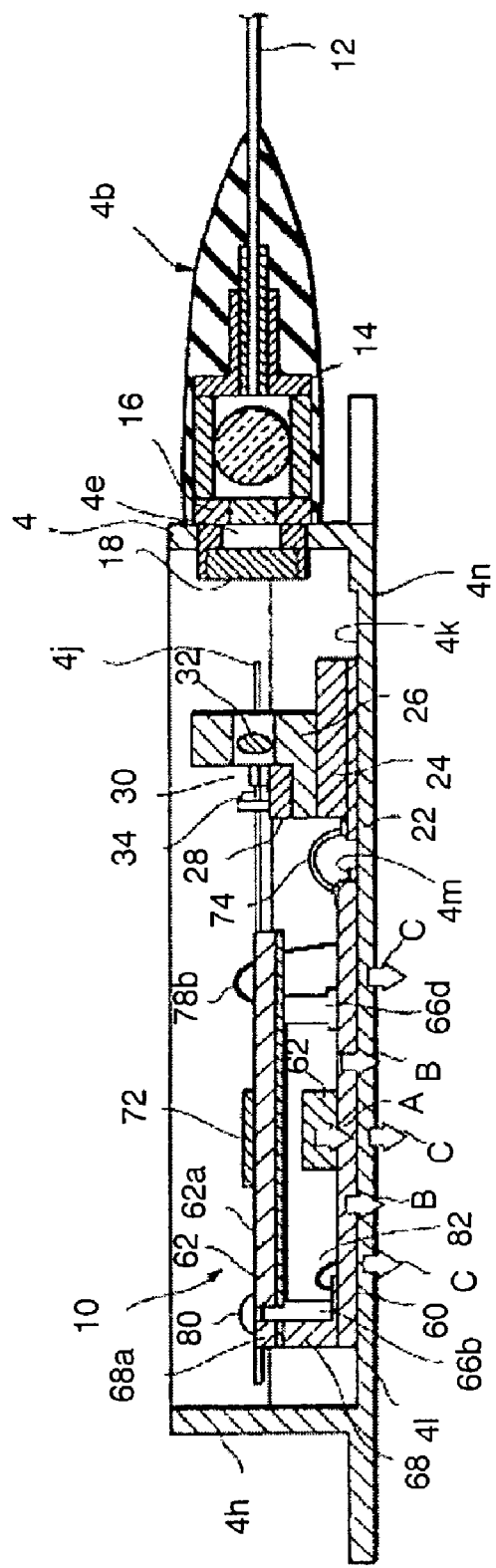
FIG. 8 is a cross sectional view along II—II line in FIG. 2.

FIG. 8 is a cross sectional view along II—II in FIG. 2. Conductive wires 80 connect electrodes (68m, 68n) on the second surface of the connector 68 to conducting patterns 62b on the second wiring substrate 62, and other wires 82 connects electrodes (68g, 68h) to patterns 60p on the first wiring substrate 60. Thus, the first wiring substrate 60 is electrically connected to the second wiring substrate 62. The inner bottom surface 4k of the housing 4 directly places the primary assembly 2 and the third sub-assembly 10, which is aligned by the projection 4m formed on the bottom surface 4k. Similarly, the first sub-assembly 6 and the second sub-assembly 8 are also directly placed on the bottom of the housing. These assemblies are fixed by soldering. These arrangements enable to diffuse heat flux A generated by the Peltier driver 70 to the first wiring substrate, the diffused flux B is transferred and diffused again to the bottom of the housing 4k, and finally the transferred flux C to the bottom surface 4k is radiated to the outside of the housing 4.

Figure 9:
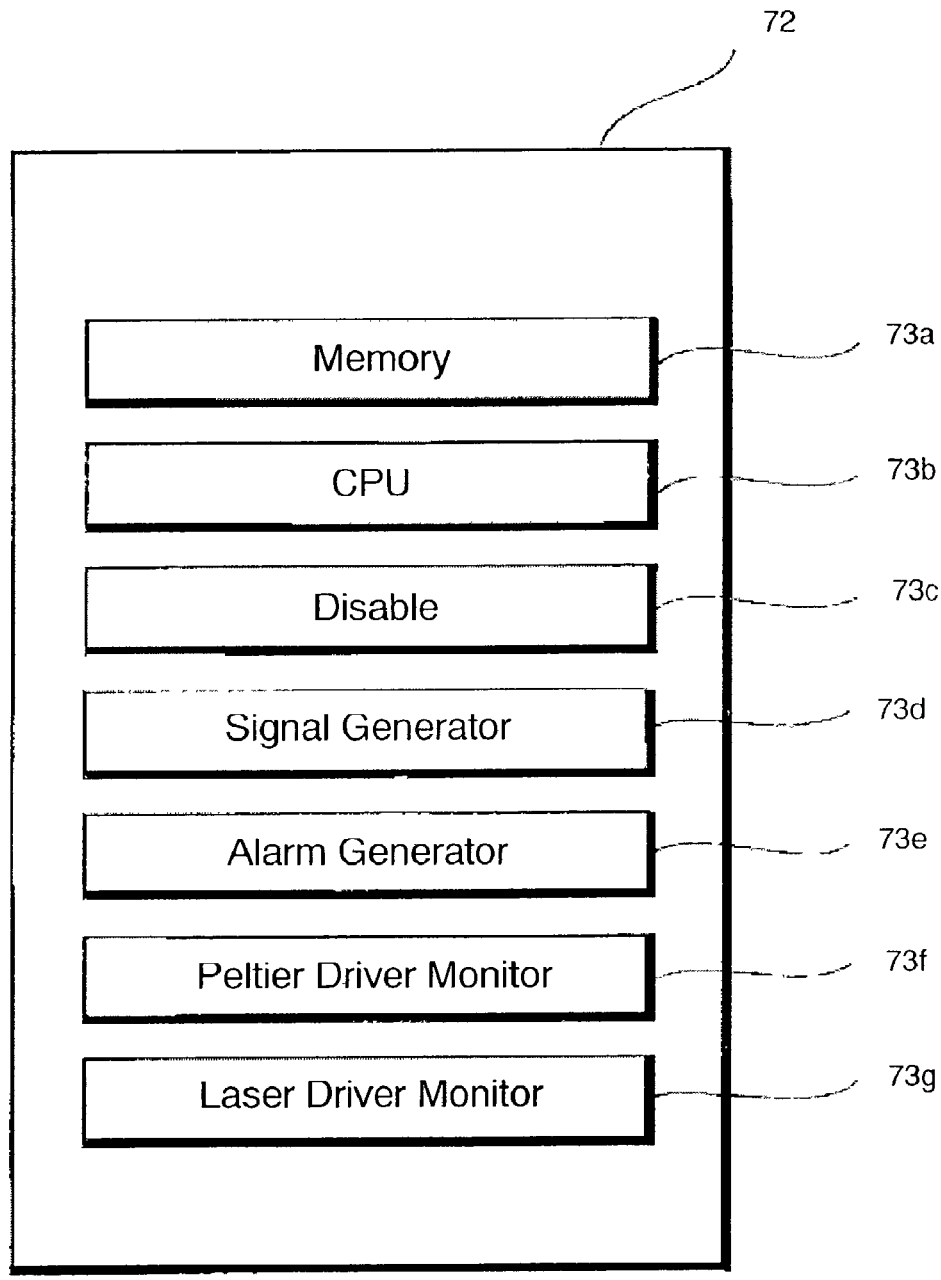
FIG. 9 is a diagram showing function of the signal processor.

FIG. 9 is a functional block diagram of the signal processor 72. The processor 72 contains a storage memory 73a, a CPU 73b, a disable means 73c, a signal generator 73d, an alarm generator 73e, a thermoelectric cooler monitor 73f, and a laser driver monitor 73g. The disable manes cuts off the laser diode by a command directed from the outside of the module. The signal generator 73d generates a signal for adjusting a wavelength of light emitted from the laser diode 30. The alarm generator 73e outputs an alarm when the module operates extraordinarily. The cooler monitor 73f generates a signal whether the cooler operates normally or not, and the laser driver monitor 73g generates a signal whether the laser driver operates normally or not.

Next will be explained a manufacturing process of the module.

Figure 10:
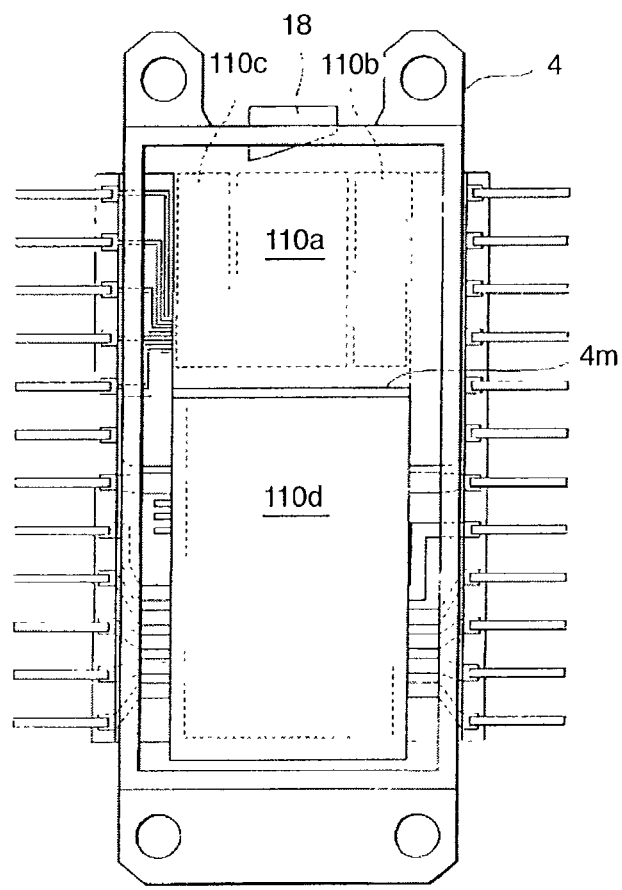
FIG. 10 is a plane view showing the inner bottom surface of the housing.

FIG. 10 is a plane view of the housing 4. The bottom of the housing is divided into two sections by the projection 4m. The one section is divided into three portions. The center portion 110a places the primary assembly 2, both sides (110b, 110c) of the center portion place the first sub-assembly 6 and the second sub-assembly 8, respectively. The third sub-assembly is placed on the other section 110d.

Figure 11:
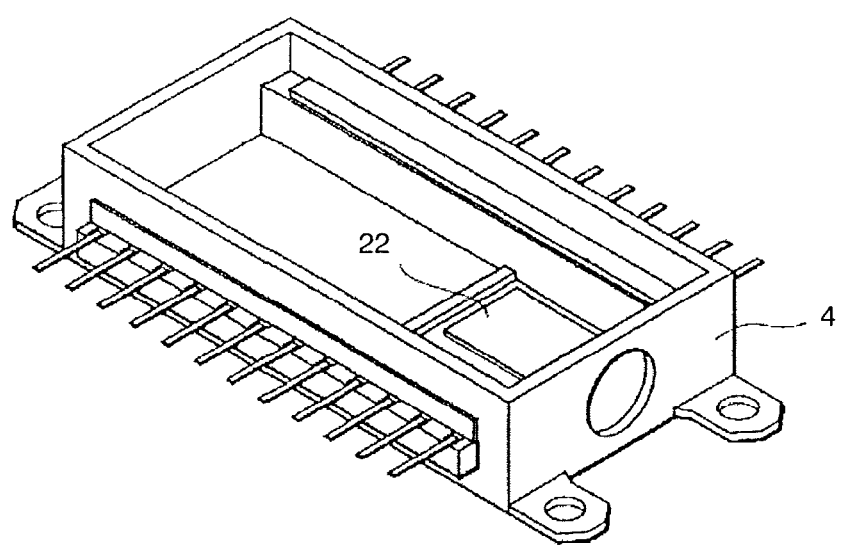
FIG. 11 shows a first assembling step of the module.
Figure 12:
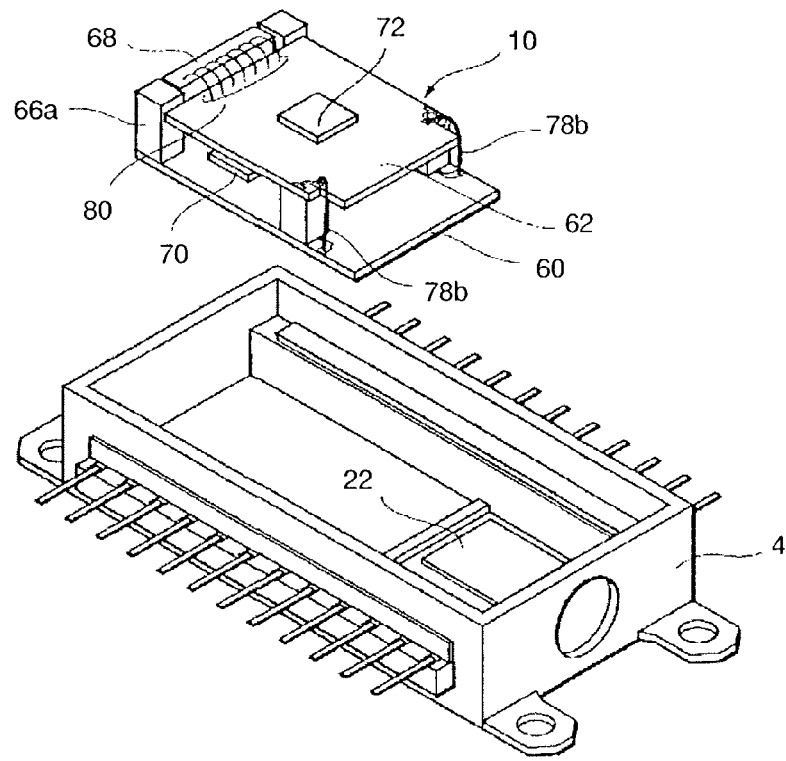
FIG. 12 shows a second assembling step of the module.

FIG. 11 shows an intermediate state after the substrate 22 is placed on the first portion of the bottom of the housing 4. The primary assembly and also the first, the second, and the third sub-assembly are concurrently constructed. Next is a construction process of the third sub-assembly. Referring to FIG. 4, the first wiring substrate 60, the Peltier driver 70 is attached thereon, places pillars (60a~60d) and the connector 68 by soldering. Subsequently, bonding wires connects conductive patterns on the first wiring substrate 60 to electrodes on the connector 68. The conducting substrate 64 is installed on pillars and the second substrate, on which the signal processor 72 is placed, is attached to the conductive substrate 64, successively. Finally, conductive patterns on the second wiring substrate 62 and corresponding electrodes on the connector 68 are connected by bonding wires. Further, the conducting patterns on the first wiring substrate and that of the second wiring substrate are connected to each other for securing current passes to the Peltier element at two cutting portions (62m, 62n) in respective corners of the second wiring substrate 62.

Figure 13:
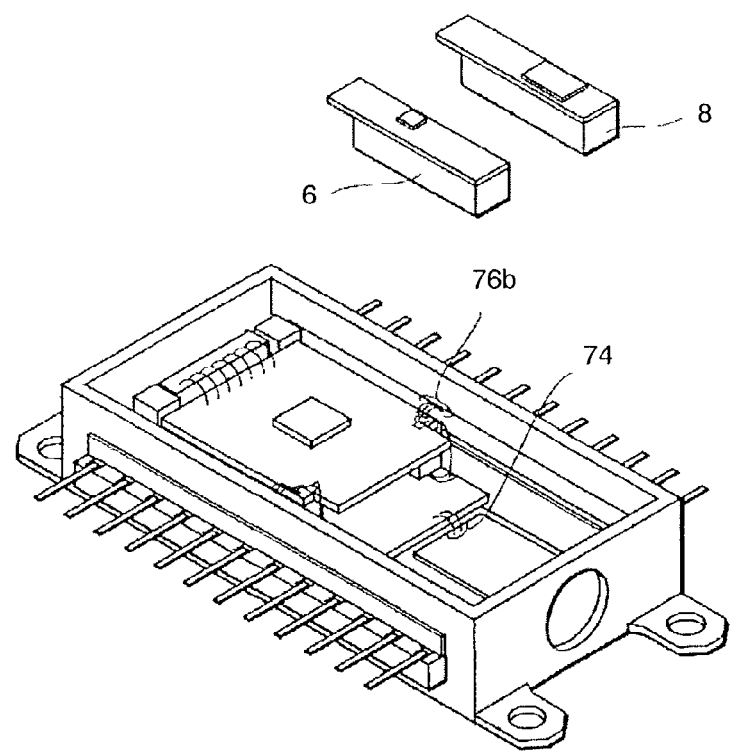
FIG. 13 shows a third assembling step of the module.
Figure 14:
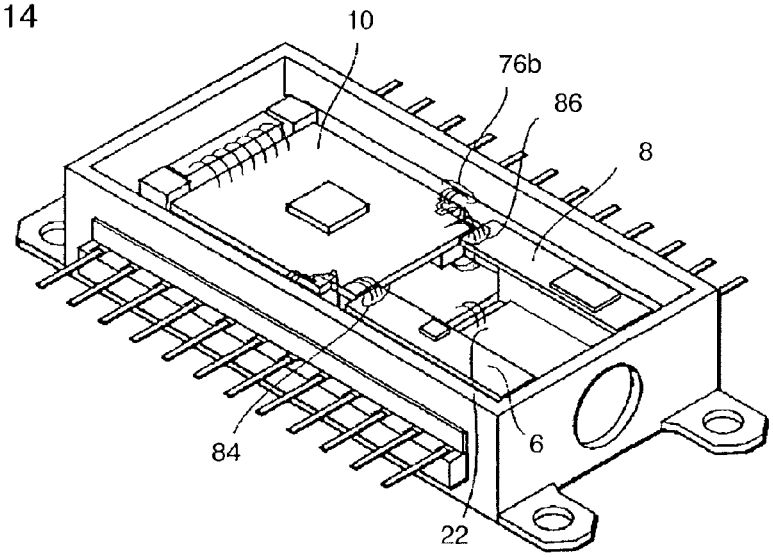
FIG. 14 shows a fourth assembling step of the module.
Figure 15:
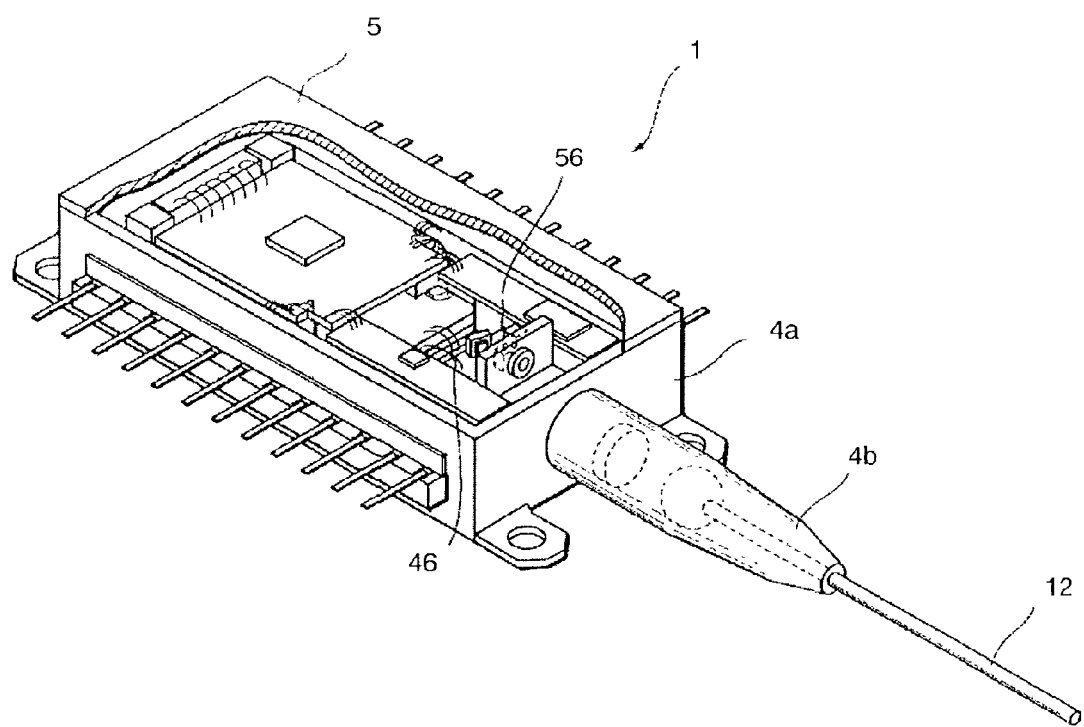
FIG. 15 is a partially cutaway view of the completed module.

The third sub-assembly thus constructed is placed on the section 110d. Bonding wires 74 connects the third sub-assembly and the substrate 22 for directing current to the Peltier element 24. As shown in FIG. 13, the first sub-assembly and the second sub-assembly are provided and placed on portions (110b, 100c), respectively. The first and the second wiring plates (40, 52) are attached to each auxiliary member in advance. Subsequently to the placement, the wire bonding 76b is performed between both wiring plates (40, 52) and corresponding lead terminals (4c, 4d). Between wiring plates (40, 52, and 62) are also connected by bonding wires (84, 86).

The primary assembly is formed as follows: The chip carrier 28 places the laser diode 30, the photo diode 34 and the thermister 36 thereon. After these devices are connected to the chip carrier 28 by wires, the Pelltier element put the chip carrier 28 thereof through the container 26. Thus constructed primary assembly is placed on the substrate 22 at the center portion 110a of the housing and wiring plates (40, 52, and 28) are connected to each other.

After the fiber is optically aligned to the primary assembly, the cylinder 4b is fixed to the front wall of the housing. Finally, the housing 4 is hermetically sealed.

SECOND EMBODIMENT

Figure 16:
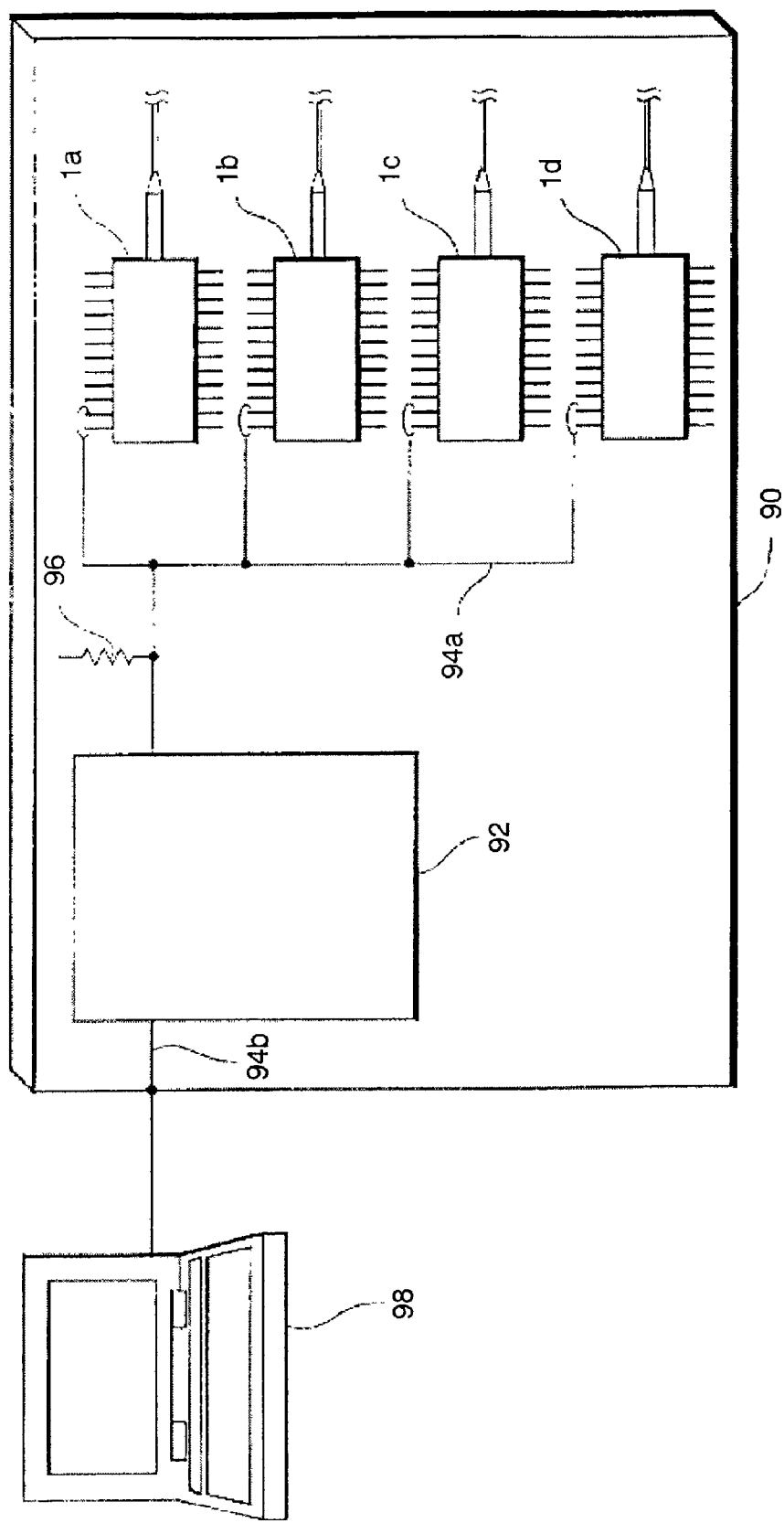
FIG. 16 is a diagram showing the multi-channel optical source using the present light-emitting module.

FIG. 16 shows a multi-channel optical source that comprises an external controller 98 that operates as a master controller and a light source 90 containing a plurality of light-emitting modules explained herein before. The light source 90 contains optical modules (1a, 1b, 1c, and 1d), a slave controller 92, a bus 94a and a pull-up impedance 96. The slave controller 92 couples to the external controller through an external bus 94b and to optical modules (1a to 1d) through the internal bus 94a. Respective buses 94a and 94b have different protocols, such as RS-232c for the external bus 94b and I²C protocol for the internal bus 94a. The slave controller reversibly converts the RS-232C protocol into I²C protocol. Especially, due to a device ID inherently assigned to the individual module in the I²C protocol, the slave controller can change the emitted wavelength and also disable the module.

Figure 17:
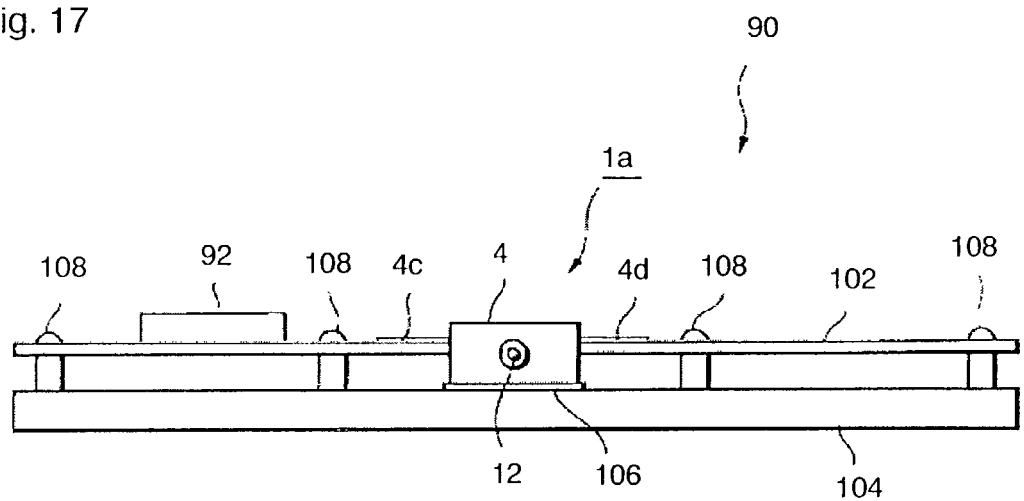
FIG. 17 is a front view of the multi-channel source.
Figure 18:
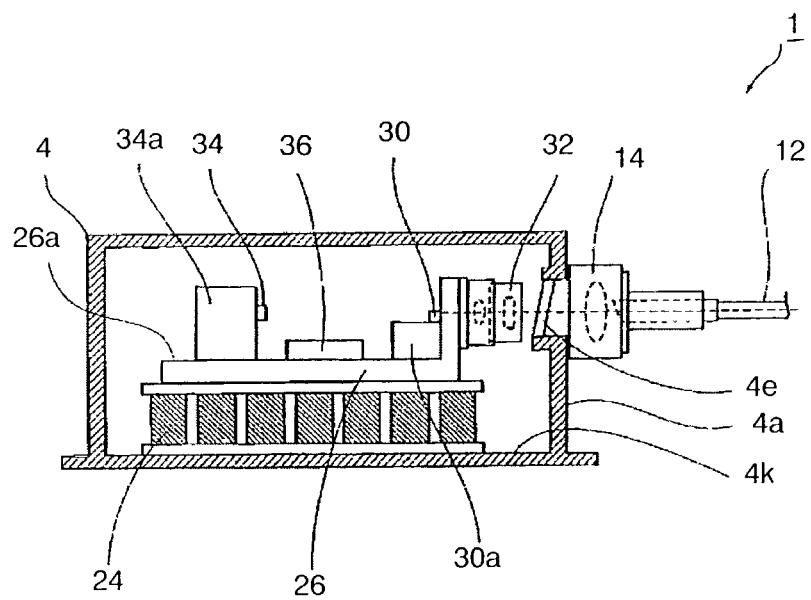
FIG. 18 shows a typical conventional light-emitting module.

FIG. 17 is a front view of the multi-channel optical source 90. The source comprises the optical module 1a, a wiring substrate 102, a heat spreader 104, a spacer 106, and a plurality of support pillar 108. The bottom of the module 1a attaches to the heat spreader 104. The spacer 106 is interposed for effective thermal transmission therebetween. This configuration enables to dissipate heat from the module 1a to the heat spreader 106. The heat spreader is made of material with good thermal conductivity, such as Aluminum, and the spacer 106 is made of material closely adherent both to the heat spreader 104 and the module 1a. Typical material of the spacer is PSG graphite. The support adjusts the level of the wiring substrate 102 so as to correspond with that of lead terminals (4c, 4d). This arrangement makes it possible that the effective heat dissipation from the optical module and the reliable electrical connection between the module and the wiring substrate. Although FIG. 17 illustrates the single module, the ordinal artisan will understand that the light source with plural modules is similarly constructed.

We claim:

1. A light-emitting module used in an optical communication system as an optical signal source, comprising:
    a primary assembly including a semiconductor light-emitting device for emitting light of predetermined wavelength at a temperature, a semiconductor light-receiving device for receiving light emitted from the light-emitting device, and a temperature-sensing device for monitoring the temperature of the light-emitting device;
    a thermoelectric element for controlling the temperature of the light-emitting device, the thermoelectric element mounting the primary assembly thereon;
    a first sub-assembly including first and second driving circuits, first and second wiring substrates, and a connector, the first and second wiring substrates mounting the first and second driving circuits, respectively, the connector connecting the first and second wiring substrates to each other so as to position the second wiring substrate above the first wiring substrate, the first driving circuit driving the thermoelectric element, the second driving circuit driving the first driving circuit; and
    a housing having a mounting space formed by a first wall, a second wall opposite to the first wall, a third wall, a fourth wall opposite to the third wall, and an inner bottom surface connecting the first, the second, the third and the fourth wall, the housing encasing the primary assembly, the thermoelectric element, and
    wherein the thermoelectric controller changes the wavelength of light emitted from the light-emitting device by controlling the temperature thereof.

2. The light-emitting module according to claim 1, further comprises a second sub-assembly including a first circuit for driving the light-emitting device and a first wiring plate for mounting the first circuit thereon, the second sub-assembly being installed between the primary assembly and the first wall of the housing.

3. The light-emitting module according to claim 2, wherein the primary assembly further contains a chip carrier for mounting the semiconductor light-emitting device, the semiconductor light-receiving device and the temperature-sensing device thereon, a level of the chip carrier being substantially coincident with a top level of the first wiring plate.

4. The light-emitting module according to claim 2, wherein the first wall contains a plurality of lead terminals, a level of the plurality of lead terminals being substantially coincident with the top level of the first wiring plate.

5. The light-emitting module according to claim 1, further comprises a third sub-assembly including a second circuit and a second wiring plate for mounting the second circuit thereon, the second sub-assembly being installed between the primary assembly and the second wall of the housing.

6. The light-emitting module according to claim 5, wherein the primary assembly further contains a chip carrier for mounting the semiconductor light-emitting device, the semiconductor light-receiving device and the temperature-sensing device thereon, a top level of the chip carrier being substantially coincident with the top level of the second wiring plate.

7. The light-emitting module according to claim 5, wherein the second wall contains a plurality of lead terminals, a level of the plurality of lead terminals being substantially coincident with the top level of the second wiring plate.

8. The light-emitting module according to claim 1, wherein the first sub-assembly is installed between the primary assembly and the third wall of the housing.

9. The light-emitting module according to claim 1, wherein the first sub-assembly further contains a conducting plate for shielding the second wiring substrate from the first wiring substrate, the conducting plate mounting the second wiring substrate thereon.

10. The light-emitting module according to claim 1, wherein the first wall and the second wall further contain a plurality of lead terminals, a top level of the second wiring substrate of the first sub-assembly substantially coincides with a level of the plurality of lead terminals.

11. The light-emitting module according to claim 1, wherein the second driving circuit further contains a means for disabling the semiconductor light-emitting device and a means for generating an alarm by monitoring the light of the semiconductor light-emitting device through the semiconductor light-receiving device and the temperature through the temperature-sensing device.

12. The light-emitting module according to claim 1, wherein the semiconductor light-emitting device is a semiconductor laser.

13. The light-emitting module according to claim 1, wherein the semiconductor light-receiving device is a semiconductor photo diode.

14. A multi-channel optical source, comprising:
    a plurality of light-emitting modules according to claim 1 for emitting light of individual wavelengths different to each other with a predetermined interval and optical powers;
    an inner control bus;
    an outer control bus; and
    a slave controller for controlling respective wavelengths and optical powers of light emitted from the plurality of light-emitting module through the inner control bus,
    wherein the inner and outer control buses have protocols different from each other.

15. The optical source according to claim 14, wherein the inner control bus has an I²C protocol and the outer control bus has an RS-232C protocol.

16. A light-emitting module, comprising:
a housing with a mounting space formed by first to fourth walls and an inner bottom surface connective the first to fourth walls, the first and second walls facing to each other, the third and fourth walls facing to each other,
a primary assembly mounted within the mounting space of the housing, the primary assembly including,
a semiconductor light-emitting device for emitting light with predetermined wavelength at a temperature;
a semiconductor light-receiving device for receiving the light emitted from the semiconductor light-emitting device;
a temperature-sensing device for monitoring the temperature of the semiconductor light-emitting device, and
a chip carrier for mounting the semiconductor light-emitting device, the semiconductor light-receiving device, and the temperature-sensing device thereon;
a thermoelectric element mounted within the mounting space of the housing, the thermoelectric element mounting the primary assembly thereon to control the temperature of the semiconductor light-emitting device;
a first sub-assembly between the primary assembly and the first wall within the mounting space of the housing, the first sub-assembly including a first circuit for driving the semiconductor light-emitting device and a first wiring plate for mounting the first circuit thereon;
a second sub-assembly arranged between the primary assembly and the second wall within the mounting space of the housing, the second sub-assembly including a second circuit for driving the semiconductor light-receiving device and a second wiring plate for mounting the second circuit thereon; and
a third sub-assembly arranged between the primary assembly and the third wall within the mounting space of the housing, the third sub-assembly including a first driving circuit for driving the thermoelectric element and a first wiring substrate for mounting the first driving circuit thereon,
wherein a top level of the chip carrier is substantially equal to a top level of the first wiring plate and a top level of the second wiring plate.

17. The light-emitting module according to claim 16,
wherein the third sub-assembly further includes a second wiring substrate positioned above the first wiring substrate for mounting a second driving circuit and a connector for connecting the second wiring substrate to the first wiring substrate, and
wherein the third wall of the housing includes a plurality of lead terminals with levels substantially equal to a top level of the second wiring substrate.

18. The light-emitting module according to claim 16,
wherein the first wall of the housing includes a plurality of lead terminals with levels substantially equal to a top level of the first wiring plate, and
wherein the second wall of the housing includes a plurality of lead terminals with levels substantially equal to a top level of the second wiring plate.

* * * * *